United States Patent
Deleonibus et al.

(10) Patent No.: US 6,955,963 B2
(45) Date of Patent: Oct. 18, 2005

(54) DAMASCENE ARCHITECTURE ELECTRONIC STORAGE AND METHOD FOR MAKING SAME

(75) Inventors: Simon Deleonibus, Claix (FR); Bernard Guillaumot, Le Fontanil (FR)

(73) Assignees: Commissariat a l 'Energie Atomique, Paris (FR); STMicroelectronics S.A., Gentilly (FR)

( * ) Notice: Subject to any disclaimer, the term of this patent is extended or adjusted under 35 U.S.C. 154(b) by 0 days.

(21) Appl. No.: 10/296,201

(22) PCT Filed: Jun. 8, 2001

(86) PCT No.: PCT/FR01/01775

§ 371 (c)(1),
(2), (4) Date: Nov. 29, 2002

(87) PCT Pub. No.: WO01/95392

PCT Pub. Date: Dec. 13, 2001

(65) Prior Publication Data

US 2004/0029345 A1 Feb. 12, 2004

(30) Foreign Application Priority Data

Jun. 9, 2000 (FR) .......................................... 00 07416

(51) Int. Cl.[7] .......................................... H01L 21/8247
(52) U.S. Cl. ...................................................... 438/257
(58) Field of Search .................................. 438/257–267, 438/926, 593–594; 257/336, 344, 316–321

(56) References Cited

U.S. PATENT DOCUMENTS

| | | | | |
|---|---|---|---|---|
| 5,801,415 A | * | 9/1998 | Lee et al. .................... | 257/316 |
| 5,856,225 A | * | 1/1999 | Lee et al. .................... | 438/291 |
| 5,960,270 A | * | 9/1999 | Misra et al. ................ | 438/197 |
| 6,002,151 A | | 12/1999 | Wollesen et al. | |
| 6,159,796 A | * | 12/2000 | Dietz et al. ................. | 438/257 |
| 2001/0002712 A1 | * | 6/2001 | Horiguchi et al. .......... | 257/315 |

FOREIGN PATENT DOCUMENTS

| | | |
|---|---|---|
| DE | 196 39 026 | 4/1998 |
| DE | 197 32 870 | 2/1999 |
| FR | 2 757 312 | 6/1998 |
| JP | 08 204032 | 8/1996 |

* cited by examiner

Primary Examiner—Richard A. Booth
(74) Attorney, Agent, or Firm—Oblon, Spivak, McClelland, Maier & Neustadt, P.C.

(57) ABSTRACT

An electronic memory having a source (118) and a drain (120) comprising on a substrate (100) a floating gate (260) and a control gate (264).

According to the invention, the floating gate (260) has a substantially U-shaped cross-section defining a space within which the control gate (264) is arranged.

7 Claims, 7 Drawing Sheets

DAMASCENE ARCHITECTURE ELECTRONIC STORAGE AND METHOD FOR MAKING SAME

TECHNICAL FIELD

The invention relates to an electronic memory and a method for manufacturing such a memory. More precisely, the invention relates to a flash type memory, for example using damascene architecture. One refers to a semiconductor component as being a damascene structure when it has a surface, superficial or intermediate, that is substantially planar, with which the imbedded conducting parts are flush in such a fashion as to evoke the weave pattern of a Damask fabric.

The invention finds its application in the manufacture of memory circuits, in particular high integration density memory circuits.

STATE OF THE PRIOR ART

An example of the well-known flash type memory is provided in document (1), whose references are indicated at the end of this description. This document illustrates also the design and production imperatives connected with the performances and characteristics expected of such a component.

In a general fashion, the goal is production of memories or memory circuits having an ever-increasing information storage capability and having higher and higher writing and reading speeds. These imperatives lead to the miniaturization of the components and to their integration with increasing densities.

The classical structure of a memory point; that is, an individual memory component, is comparable to that of a field effect transistor having a source, a channel and a drain. However, the channel is capped not by a single gate but by a gate structure comprising a floating gate and a control gate electrically insulated from the floating gate. In order to enable programming and fast reading, a memory must have a certain capacitance ratio with the first capacitance existing between the floating gate and the control gate and a second capacitance existing between the floating gate and the substrate. In particular, this ratio must be greater than 1 and is determined as a function of the electrical parameters of the memory.

To achieve these very high integration densities it is common to reduce the size of the memory points. This involves a reduction of the size of their gates and thus of the thickness of the gate insulator that separates the floating gate from the subjacent channel. The reduction in the thickness of the gate insulation leads to an increase in the electrical capacitance existing between the floating gate and the channel or the substrate. In order to conserve the ratio between the aforesaid capacitances, it is advantageous then to also increase the value of the capacitance between the floating gate and the control gate. This capacitance can be slightly increased by selecting an inter-gate insulator with a dielectric constant as high as possible but which remains limited by the reduction in the size of the gates imposed by miniaturization of the component and that of the thickness of the gate insulator. In fact, for a gate insulator thickness of less than 9 nm, problems of information loss appear that are connected with a charge loss over the oxide.

One significant difficulty thus exists in reconciling the imperatives of integration and of maintaining the functionality characteristics of the memories.

By way of illustration of the state of the art and more particularly of the manufacturing methods of memory or transistor components, reference is made to documents (2) and (3), whose complete references are provided at the end of this description.

EXPLANATION OF THE INVENTION

The object of the present invention is to provide a memory as well as a method of manufacturing such a memory, which does not have the aforementioned limitations and drawbacks.

A further object is to provide a memory capable of high integration and which has an improved floating gate-control gate capacitance relative to that of known memory devices.

Yet another object is to provide a method of manufacturing the memory that is both economical and compatible with the requirements of high integration.

More precisely, in order to achieve these objectives, the invention has the object of an electronic memory having a source and a drain comprising on a substrate a floating gate and a control gate. According to the invention the floating gate has a substantially U-shaped cross-section defining a space within which the control gate is housed.

By virtue of the U-shape of the floating gate, a surface abutting between the floating gate and the control gate can be made thicker then the surface abutting between the floating gate and the substrate. This enables having available a capacitance ratio matched to fast writing and reading and allows reduction of the writing voltages.

$$\frac{C_{int}}{C_{ox}} = \frac{e_{ox}}{e_{int}} \times \frac{\varepsilon_{int}}{\varepsilon_{ox}} \times \frac{S_{ox}}{S_{int}}$$

In these expressions $C_{int}$ and $C_{ox}$ designate, respectively, an inter-gate capacitance, whose dielectric is an inter-gate insulator layer, and a capacitance formed between the floating gate and the substrate, whose dielectric is a gate insulating layer. The terms $e_{ox}$, $e_{int}$, $\varepsilon_{ox}$, $\varepsilon_{int}$, $S_{ox}$ and $S_{int}$ designate the thickness, the dielectric constant and the surface, respectively, of the gate oxide (ox) and the inter-gate oxide (int).

Now, if the writing (programming) voltages are reduced it would be appropriate to increase the ratio $$\frac{C_{int}}{C_{ox}},$$

which is possible using the memory according to the invention.

More precisely, the inventive memory can be such, that:
 the control gate has a first face facing toward the substrate and faces, called lateral faces, substantially perpendicular to the first face, facing towards the source and the drain, respectively;
 the floating gate has a first part arranged between the first face of the control gate and the substrate relative to said first face of the control gate;
 the floating gate has, in addition, second and third parts, called lateral parts, substantially perpendicular to the first part and arranged facing the lateral faces of the control gate.

It is emphasized that the facing surface between the floating gate and the control gate corresponds substantially to the sum of the surface of the first face and that of the lateral faces of the control gate. In return, the facing surface between the floating gate and the substrate is limited to the surface of the first part of the floating gate; that is, around the surface of the first face of the control gate.

In a particular embodiment of the memory component according to the invention, said memory comprises an inter-gate insulating layer arranged between the floating gate and the control gate. This layer also has a substantially U-shaped cross-section arranged on the floating gate and on the control gate.

Different possibilities for forming the gate insulating layer will be described in the following text.

The invention also relates to a method of manufacturing a memory, for example, as indicated hereinafter. The method comprises the following successive steps:

a) the formation of a dummy gate on a substrate;

b) realization within the substrate of a source and a drain, automatically aligned on the dummy gate;

c) coating of the dummy gate with a coating layer and planishing of said layer stopping at the dummy gate;

d) removal of the dummy gate in order to expose a gate well destined to receive the floating gate and the control gate;

e) deposition of at least a first gate layer, at least an inter-gate insulating layer, at least a second gate layer and forming layers in order to define a floating gate and a control gate separated by an insulating inter-gate insulator, the first gate layer and the insulating inter-gate layer having an overall thickness of less than the height of the well.

The dummy gate plays an important role in fixing the placement and the dimensions of the final gates. It can be used also as an implantation mask when forming the source and the drain. In fact, when these regions are formed by dopant impurity implantation, they are automatically aligned on the sides of the dummy gate and thus on those of the final gates that will replace the dummy gate.

In the case of realization of a set of memories, in particular a set of aligned memories, one common dummy grid can be used for said set of memories.

The source and the drain of each memory can be formed, for example, in one or two implantation steps by using the dummy gate each time as the implantation mask. It is thus further possible to provide the dummy gate with lateral spacers which line the sides. When these spacers are formed between the two implantation steps, gradual source and drain regions are obtained in a well-known method per se.

Finally, a description is appropriate of the role of the dummy gate when siliciding the source and drain regions. When the materials used for the dummy gate and those used for the lateral spacers are so chosen as not to react with a siliciding metal, it is possible to deposit said metal on the entirety of the structure and then to subject said structure to a thermal treatment using a temperature that is sufficient to induce siliciding. Siliciding occurs only in the regions where the metal is in direct contact with the silicon. Such siliciding is qualified as selective.

The inventive process offers several possibilities for mutual electrical insulation of the layers of material forming the floating gate and the control gate. The insulation should be provided between the layers and at the ends of same. The ends considered here correspond to the limits of extension of the layers in a direction transverse to the drain-source direction; that is, along the drain and along the source, perpendicular to the direction of circulation of a channel current.

To achieve this and according to a first possibility, step e) of the method can comprise:

deposition of the first gate layer and the inter-gate insulating layer;

etching of these layers in order to define their extension along the source and the drain;

electrically insulating cut-out sides of the layers obtained by etching;

deposition of the second gate layer with a thickness that is sufficient to fill the gate well;

polishing of the second gate layer, the inter-gate insulating layer and the first gate layer and stopping at the coating layer.

Electrical insulation of the cut-out sides can be done, for instance, by oxidation of said sides or by covering said sides using a layer of dielectric, comparable to the lateral spacers of the gate.

It is also possible to take advantage of the inter-gate insulating layer to electrically insulate the sides of the cut. In this case step e) of the method can comprise the following, in the order:

deposition of the first gate layer;

etching of the first gate layer in order to define its extent along the source and the drain;

deposition of the inter-gate insulating layer and the second gate layer, the inter-gate insulating layer having together with the first gate layer a total thickness that is less than the height of the gate well, and the second grid layer having a thickness sufficient for filling the grid well;

polishing of the second gate layer, the inter-gate insulating layer and the first gate layer and stopping at the coating layer.

The coating layer of the dummy gate has, in the context of this method, essentially the role of "mold" to form the gate well after the removal of the dummy gate. The coating material can, however, be seen as having other functions as well. For example, the coating material can be so chosen as to be an electrical conductor and provide contact access for the source and the drain.

The coating material can also be so chosen as to be electrically insulating in order to insulate, for example, different components formed on the same substrate. In this case, the contact passages are created in the coating layer in line with the source and the drain in order to electrically connect them to interconnection lines, for example. The interconnection of the components is current technology and conventional in microelectronics and will not be further discussed herein.

Other characteristics and advantages of the invention can be read from the following description with reference to the annexed drawing figures. This description is provided purely illustratively and non-limitingly.

DETAILED DESCRIPTION OF THE IMPLEMENTATION METHODS OF THE INVENTION

Identical, similar or equivalent elements of the different figures hereinafter described show the same numerical references in order to facilitate the relationships between the figures. Otherwise, although the description relates to the manufacture of the components on a massive substrate, in the case of silicon, it must be emphasized that the methods are identical for the formation of components on an insulated thin-layer substrate such as the SOI ("silicon on insulator") substrates.

Finally, the different parts of the component represented in the figures are not necessarily to uniform scale with it in order to render them more readable.

Figure 1:
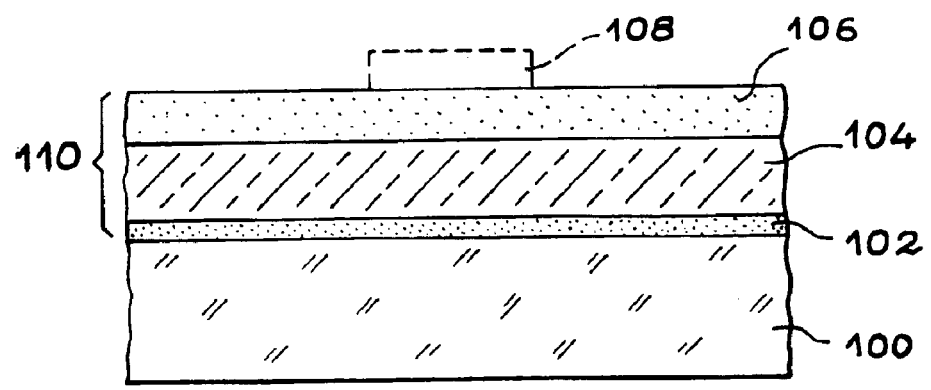
FIGS. 1 and 2 represent schematic sections of a semiconductor structure illustrating the realization of a dummy gate at the time of implementation of the procedure according to the invention.

FIG. 1 represents a silicon substrate 100 whose surface has been oxidized to form a silicon oxide layer 102 called the pedestal layer.

Successive depositions are made on the layer 102, a layer of polycrystalline or amorphous silicon 104 then a layer of silicon nitride 106. The set of layers forms a stack 110. The total thickness of the layers 104 and 106 is, for example, of the order of 100 to 500 nm and corresponds substantially to the total thickness of the gates of a memory point that will be finally obtained in the course of the manufacturing process.

An etching mask 108, represented by the broken line, such as a photosensitive resin mask is formed on the silicon nitride layer 106. This mask defines the placement, the size and the form of a dummy gate that will be realized within the stack 110.

With the exception of a portion protected by the mask 108, layers 102, 104 and 106 of the stack 110 are removed by etching.

Figure 2:
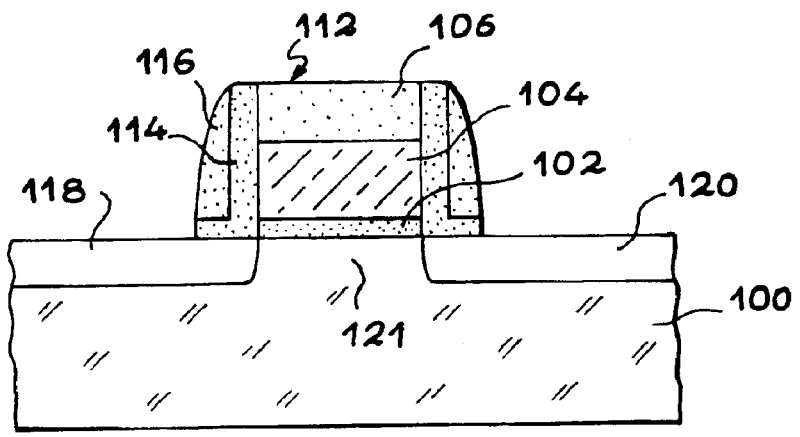

This portion of the stack forms the body of the dummy gate, marked using reference 112 on FIG. 2.

The formation of the dummy gate is followed by a first low-dose ion implantation. By way of example, at the time of the first implantation boron, phosphorus or arsenic ions can be implanted at a dose of $10^{13}$ to $10^{14}$ cm$^{-2}$ at an energy of 3 to 25 keV.

The first implantation is followed by the formation on the side or sides of the dummy gate of lateral spacers 114, 116, which can be seen in FIG. 2.

The lateral spacers comprise a first silicon oxide layer 114 in contact with layers 104 and 106 of the dummy layer. A second layer 116, superficial, of silicon nitride covers the oxide layer. The first spacer layer 114 essentially acts to limit the constraints of contact with the layers of the dummy layer material; namely, with the polycrystalline silicon. It limits also the contact constraints with a small portion of substrate that it touches at the base of the dummy gate.

The second spacer layer 116 essentially acts to protect the dummy gate from subsequent treatments of the method and in particular the siliciding treatments.

The formation of the lateral spacers can be carried out using methods known per se and which essentially provide the deposition of the selected material as a blanking flange at the time of anisotropic etching of said materials in order to allow only a thin layer to remain on the sides of the dummy gate.

Eventually, after the formation of the lateral spacers, a second impurity implantation can be done at a higher dose, for example of $10^{14}$ to $5.10^{15}$ at/cm$^2$. Thus the second implantation uses the dummy gate as the implantation mask. It enables obtaining in gradual source and drain regions 118, 120 in the substrate with doping that diminishes as it approaches the channel 121. The gradual character of the source and drain regions is intentionally not shown in the figures for reasons of clarity.

Figure 3:
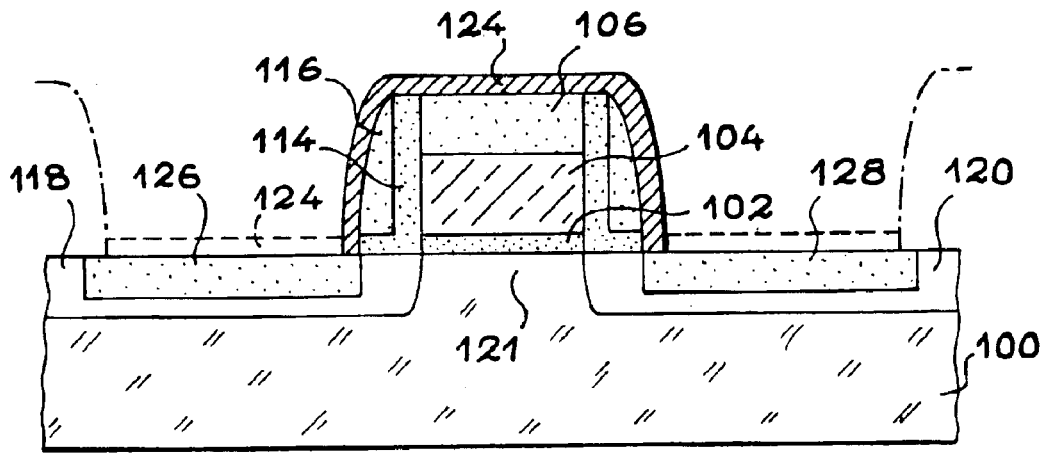
FIG. 3 represents auto-aligned siliciding practices on a structure as represented in FIG. 2.

FIG. 3 shows a following step which comprises effecting selective siliciding of the substrate in the source and drain regions. This operation comprises the deposition of a metal layer 124 such as, for instance, titanium, cobalt or nickel then thermal treatment at a temperature sufficient to produce a siliciding reaction between the metal and the silicon of the substrate. The siliciding enables locally increasing the conductivity of the source and the drain, thus reducing their access resistance.

Siliciding is qualified as selective in so far as it is limited to the zones in which the metal of the layer 124 is directly in contact with the silicon. It can be seen in FIG. 3 that the metal layer 124 has disappeared above the source and drain regions to form there superficial layers of silicide 126, 128. On the other hand, the metal layer 124 persists above and on the sides of the dummy gate. In fact, on those parts, the silicon nitride of the layers 106 and 116 of the dummy gate and the spacers has prevented siliciding.

In a slightly enlarged view provided in FIG. 3 shows sections in mixed lines, other dummy gates eventually realized on the same substrate.

Figure 4:
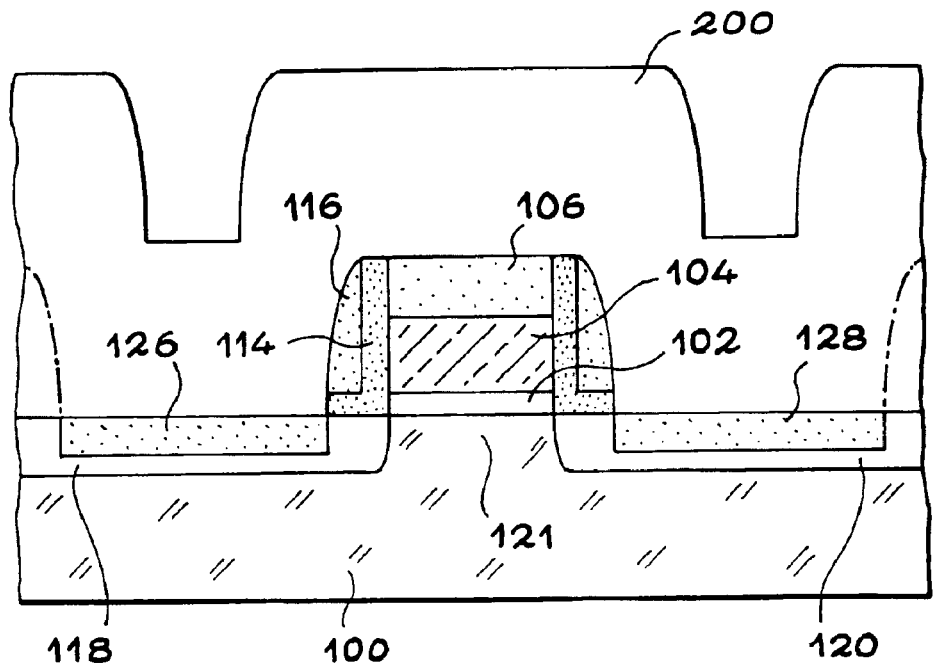
FIGS. 4 and 5 represent the formation of a coating layer on a structure as represented in FIG. 3.
Figure 5:
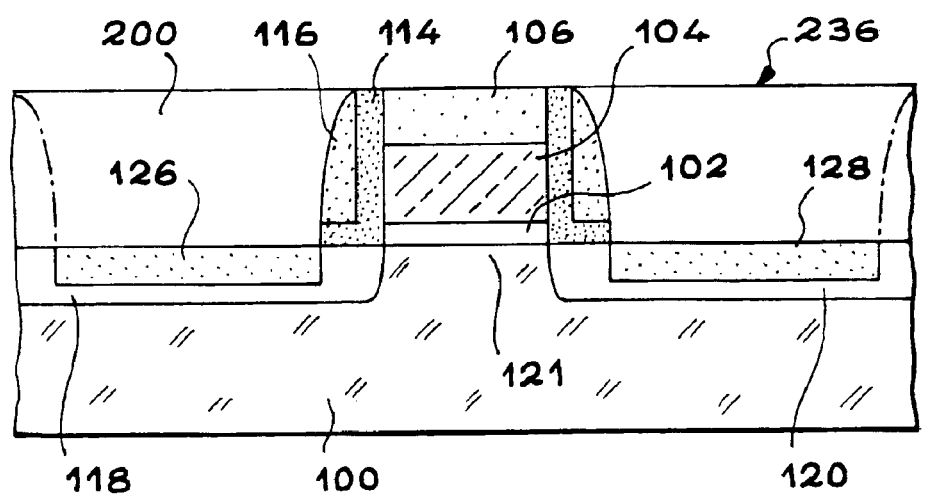

FIGS. 4 and 5 represent a coating operation for the dummy gate. A thick layer of coating material 200 is deposited on the whole structure to develop the form. It can be seen that the coating layer has a thickness that is greater than the height of the dummy gate. The coating material can be so selected as to be a conductor or an insulator. In the example described, it is a silicon oxide layer, for example; in other words, it is an electrically insulating material.

FIG. 5 represents the result of a planishing operation at the time of which the coating layer has been polished in order to provide it with a smooth, flat surface 236. Polishing is done as far as the silicon nitride layer 106 of the dummy gate in order to render it flush with the planar surface 236. It can be noted that when the coating material is an electrical conductor, planishing up to the silicon nitride layer leads to electrical separation of the source and the drain.

Figure 6:
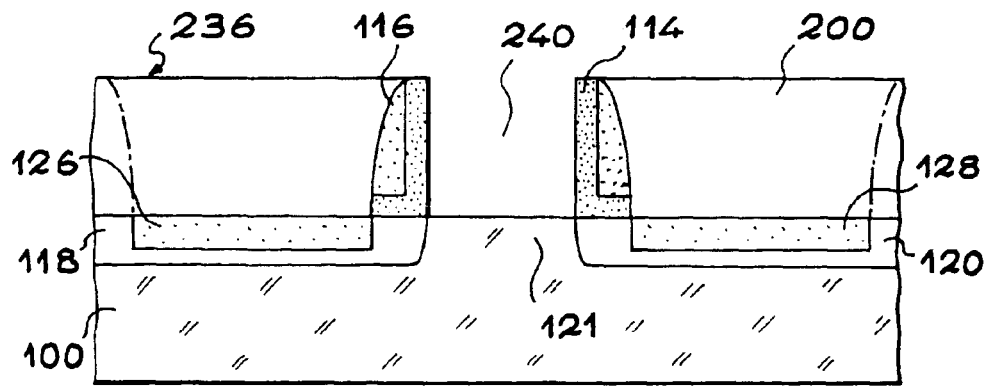
FIG. 6 represents the removal of the dummy gate from a structure as represented in FIG. 5.

A subsequent step of the method comprises, as shown in FIG. 6, the removal of the dummy gate to form a well 240 delimited by the lateral spacers 114, 116 and surrounded by the coating layer 200. Removal of the dummy gate includes successive etching of the layers 104, 106 comprising the dummy gate, then etching of the pedestal layer 102, which, in this example, is also removed.

Figure 7:
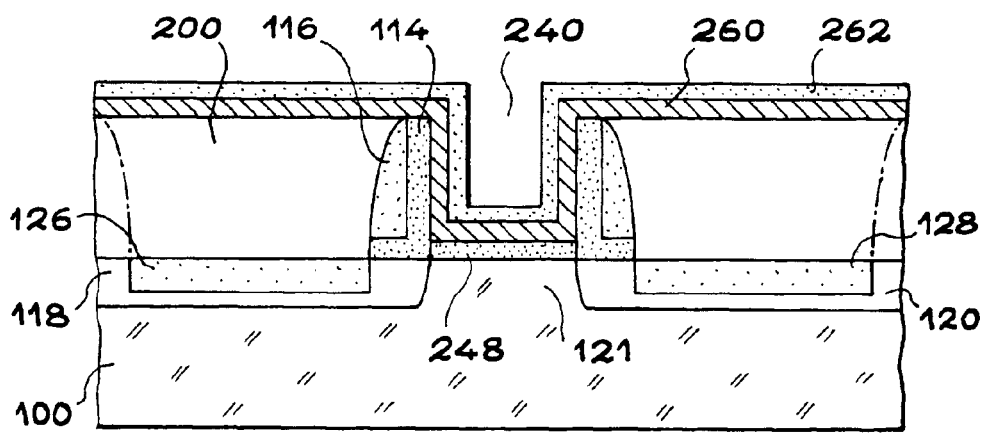
FIGS. 7, 8 and 9 represent, in section, the realization of a final gate using a structure as represented in FIG. 6.

FIG. 7 represents a first series of operations for realizing a final gate. At the very start a gate insulating layer 248 is formed at the bottom of the well 240. It is, for example, a layer of silicon oxide obtained by deposition of $SiO_2$ or by oxidation of the underlying substrate 100. Then a first gate layer 260 is deposited followed by an inter-gate insulating layer 262.

The first gate layer can be formed, for example, using a material selected from among Si, W, TaN, W/TiN, Ti, TaN or Cu/TaN, W/Nb, W/RuO$_2$ or from a stack of sub-layers formed from these materials. The inter-gate insulating layer can also be massive or formed from a stack of dielectric sub-layers. A stack of oxide/nitride/oxide offers the advantage of a high dielectric constant, for example.

The inter-gate insulating layer can also be a high dielectric constant (HiK) insulator. The thickness of this layer is given, for example, by the ratio of the dielectric constants:

$$\frac{\varepsilon_{HiK}}{\varepsilon_{ONO}} = \frac{t_{HiK}}{t_{ONO}}$$

In this expression $\varepsilon_{HiK}$, $\varepsilon_{ONO}$, $t_{HiK}$, and $t_{ONO}$ are the dielectric constants and the thicknesses, respectively, of a high dielectric constant material and an oxide/nitride/oxide stack.

This HiK material is, for example Al$_2$O$_3$ ($\varepsilon$=12), TiO$_2$ ($\varepsilon$=40), HfO$_2$ ($\varepsilon$=25) and BST ($\varepsilon$>200 in thin layer).

Preferably, an inter-gate material is chosen having a dielectric constant greater than that of the gate insulator. When these materials are an oxide/nitride/oxide stack and silicon oxide, respectively, the thickness of the layers is, for example 140 Å (O/N/O) and 90 Å (oxide), respectively.

It can be seen in FIG. 7 that the overall thickness of the first gate layer and of the gate insulating layer is less than the depth of the well 240; that is, less than the height of the previously removed dummy gate. In this evaluation the thickness of the gate insulating layer 148 is neglected which, just as in the inter-gate insulating layer, is represented using exaggerated thicknesses for reasons of clarity in the figures.

At this stage in the method, even prior to the deposition of the inter-gate insulating layer, the operations of etching and/or insulation of certain parts can be done. These operations do not appear in FIG. 7 but will be described later.

Figure 8:
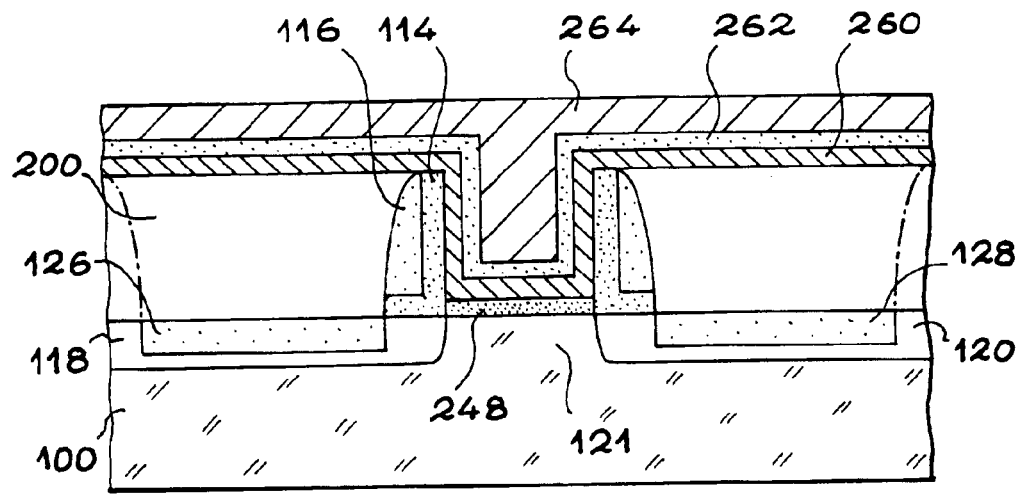
Figure 9:
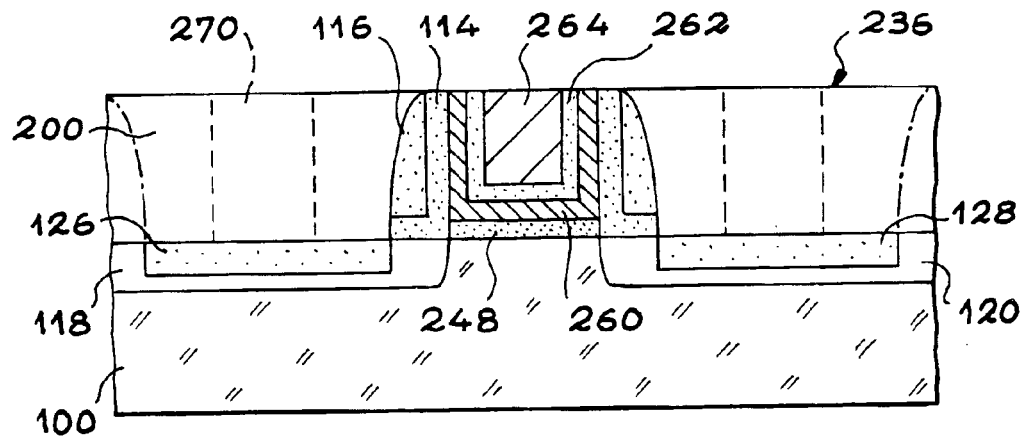

FIGS. 8 and 9 show the completion of the memory component. A second gate layer 264 of one or a plurality of conductor materials chosen from among those previously mentioned for the first gate layer is deposited on the inter-gate insulating layer 262. As shown in FIG. 8, the thickness of the second gate layer is sufficient to completely fill the part of the well not already occupied by the other final gate layers.

As shown in FIG. 9, deposition of the second gate layer is followed by planishing which enables removal of all of the materials that pass to the top of the coating layer 200 to expose its superficial face 236. This operation concludes the manufacturing process of the memory itself. However, it can be complemented by the interconnection of the memory component with other components, whether realized on the same substrate or not. The interconnection operations depart from the strict context of the invention and are of themselves well-known. Therefore, they are not described here. Simply, the broken lines indicate the position of the contact 270 that is possible to practice in the coating layer 200 for connecting the source and the drain to interconnection lines (not shown).

FIG. 9, which corresponds to a sectional drawing of the component passing through the source and the drain, shows the U-shape of the floating gate finally obtained using the first gate layer. The floating gate is separated from the control gate by the inter-gate insulating layer, also U-shaped. It surrounds the control gate on three sides, in this instance, the side facing the channel 121 and the two lateral sides perpendicular to the substrate.

For reasons of convenience, the references 260 and 264 are used in the continuation both to designate the first and second gate layers and to designate the floating gate and the control gate, respectively, formed by said layers.

Figure 10:
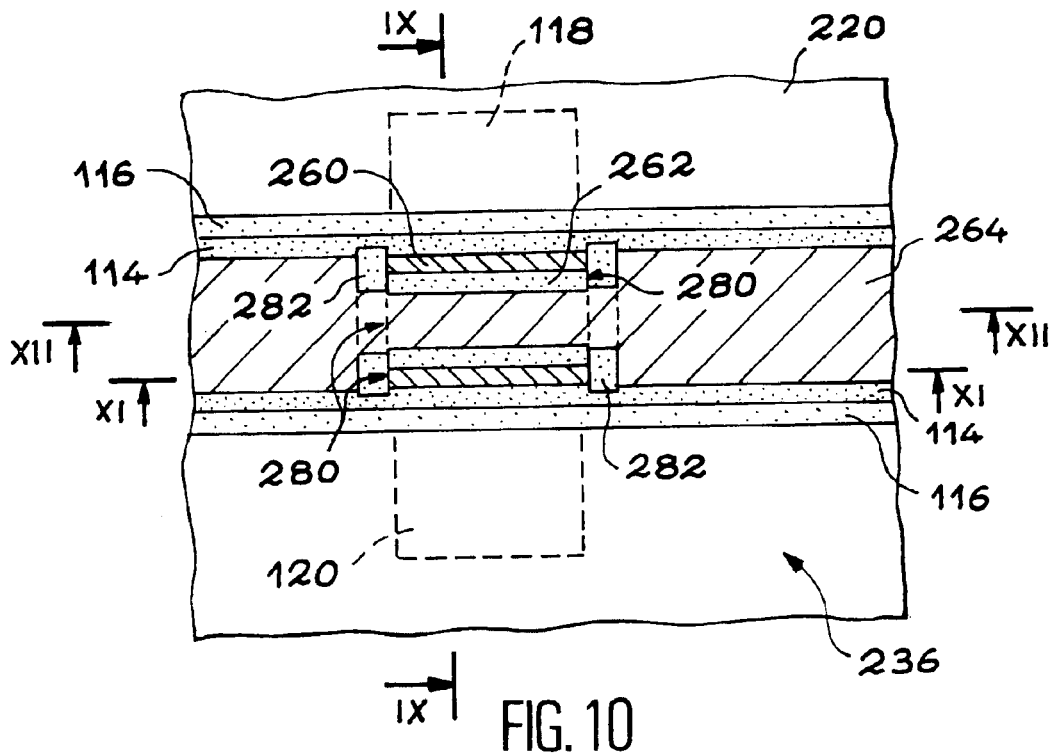
FIG. 10 is a top view of a structure comparable to that of FIG. 9 and with represents a first possible embodiment of the gates.

FIG. 10 is a view from above of the memory component of FIG. 9. It corresponds to a particular implementation of the inventive method in which the first gate layer 260 and the inter-gate insulating layer 262 have been formed first and then the layers cut out prior to forming the second gate layer 264. This partitioning corresponds here to an etching of the layers that is intended to fix their extension along the source and the drain 118, 120. In the figure, the placement of the source and the drain 118, 120 regions, hidden by the coating layer, is indicated by the broken line. The edges of the first gate layer and the inter-gate insulating layer, as fixed by the cut out, are indicated by the arrows 280. The reference 282 indicates an insulating layer called edge insulating layer, which covers the cut edges of the first gate layer and the inter-gate insulating layer. The edge insulating layer can be obtained by oxidation of the cut edge of the first gate layer. It can also be formed by depositing a layer of dielectric material and then by anisotropic etching of said material as in the formation of the lateral spacers on the sides of the dummy gate. The edge insulating layer 282 allows the electrical insulation of the first gate layer 26 and the second gate layer 264, formed subsequently, on the cut edges 280.

FIGS. 9 and 10 represent the so-called damascene structure that is characterized by the exposure of the metallic layers and in particular the second gate layer forming the control gate, to the free surface 236 of the coating layer. In FIG. 10 one observes also that the second gate layer 264 can be extended parallel to the source and drain regions (perpendicularly to the sectional plane of FIG. 9) in order to form a line of words, for example.

Figure 11:
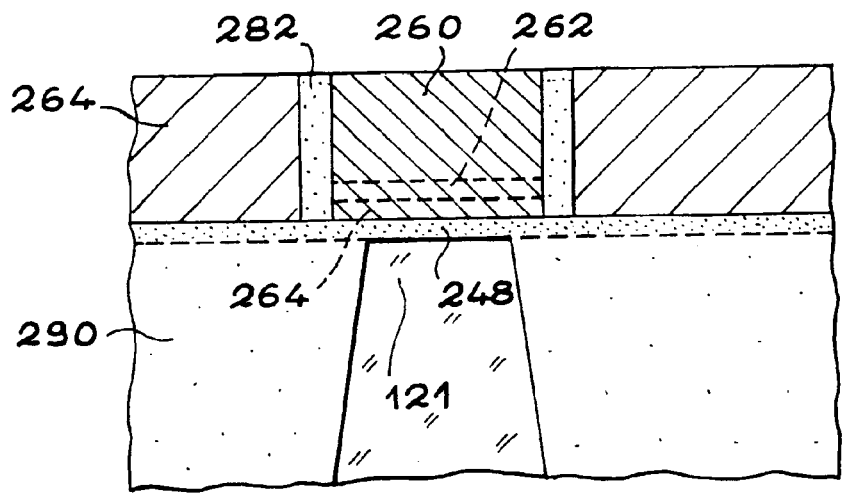
FIG. 11 is a schematically represented section along the XI—XI plane of the structure represented in FIG. 10.
Figure 12:
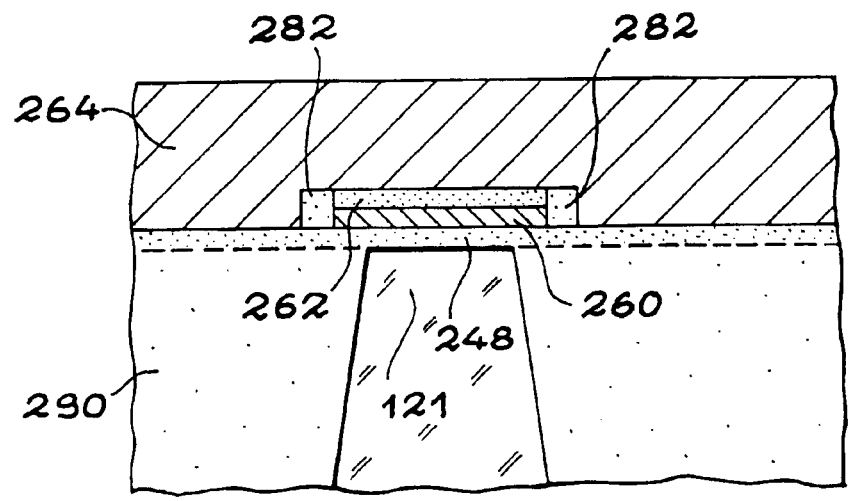
FIG. 12 is a schematically represented section along the XII—XII plane of the structure represented in FIG. 10.

Finally, several sectional planes IX—IX, XI—XI and XII—XII have been indicated in FIG. 10, which correspond to FIGS. 9, 11 and 12.

FIG. 11 is a section of the structure represented in FIGS. 9 and 10 along a sectional plane which traverses, at its middle, the part of the first gate layer 262 ascending to its lateral spacers 114, 116. It enables better demonstration of the edge insulation 282 that laterally delimits the floating gate 260. The inter-gate insulating layer 262 and the second gate layer 264 forming the control gate are indicated by the broken line because of being hidden by the first gate layer (floating gate). The reference 290 designates a deep silicon oxide trench practiced in the substrate 100 in order to insulate the memory component from other components formed on the same substrate.

FIG. 12 is a section of the structure represented in FIGS. 9 and 10 that traverses, at its middle, the control gate in a direction perpendicular to the plane of FIG. 9. This section illustrates the first gate layer 260 and the gate insulating layer 262 that have been cut and protected by the edge insulating layer 282 prior to the formation of the second gate layer 264.

Figure 13:
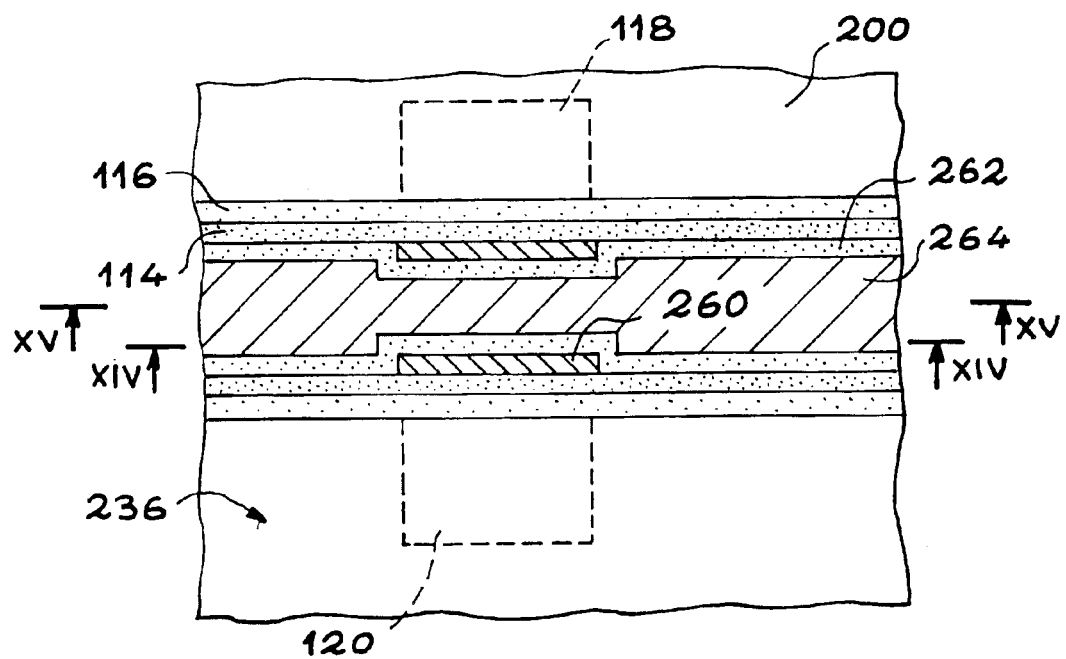
FIG. 13 is a top view of a structure comparable to that represented in FIG. 9 and represents a second possible embodiment of the gates.

FIG. 13 represents a top view of a component comparable to that of FIG. 9 and illustrates another possible embodiment of the floating gate and the control gate. According to this variation of the method, initially the first gate layer 260 is deposited and then this layer is cut out, prior to depositing the inter-gate insulating layer 262 and the second gate layer 264. The cutting of the first gate layer 260, done by etching of same using an appropriate etching mask, is intended to fix its extension parallel to the source and drain regions. In sum, the cutting is indistinguishable from that done in the previously described variant, save for the fact that it does not relate to the first gate layer, without affecting the inter-gate insulating layer subsequently deposited. It can be seen in FIG. 13 that no edge insulating layer is provided.

Figure 14:
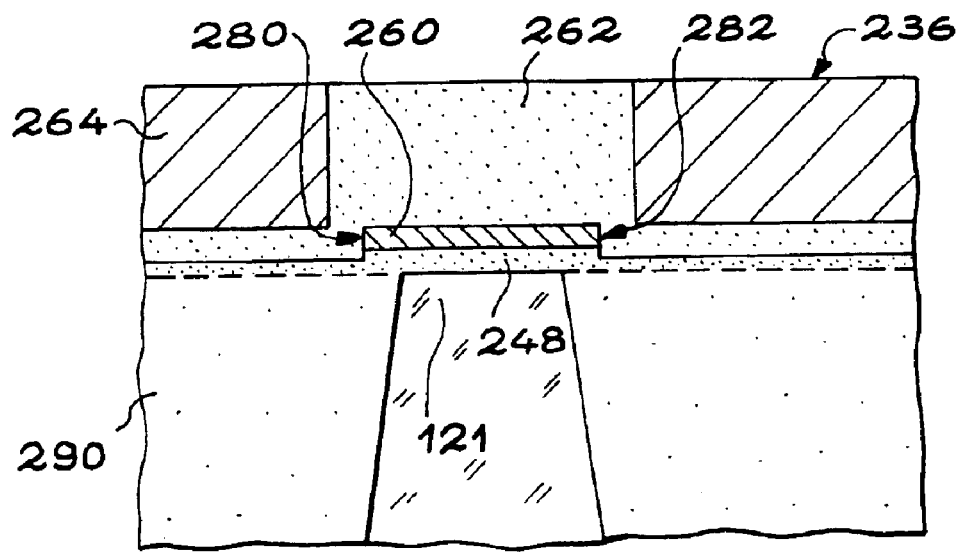
FIG. 14 schematically represents a section of the structure represented in FIG. 13 along a XIV—XIV plane.

The fact that a specific insulation of the cut edges of the first gate layer is useless in a component conforming to FIG. 13 becomes even clearer in FIG. 14. FIG. 13 is a section of the structure of that represented in FIG. 13 along a sectional plane XIV—XIV which traverses, at its middle, the part of the inter-gate insulating layer that rises up along the spacers 114, 116 and along the lateral sides of the floating gate and the control gate. It can be seen that the cut edges of the first gate layer 260, identified with reference 280 by analogy to FIGS. 11 and 12, are entirely covered and insulated from the second gate layer 264 by the inter-gate insulating layer 262. This caps in some fashion the floating gate 260.

Figure 15:
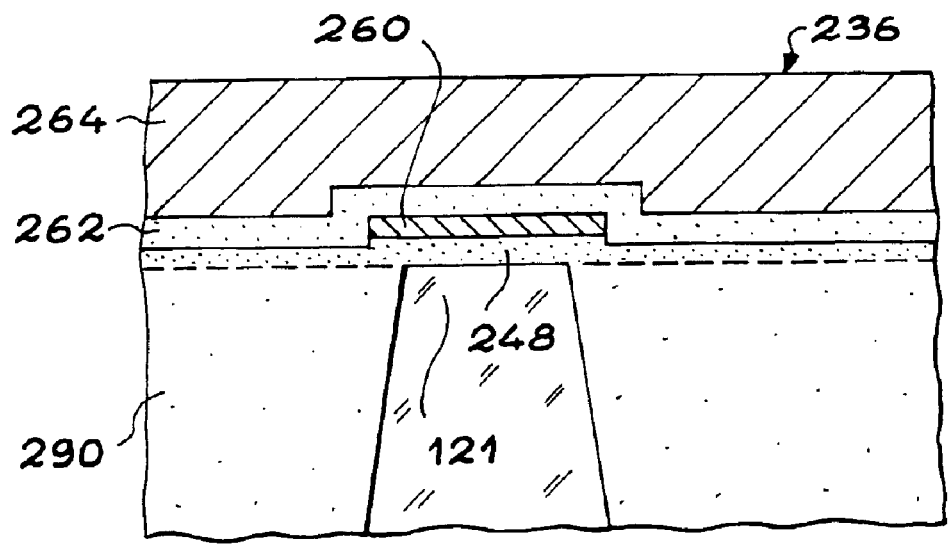
FIG. 15 schematically represents the structure represented in FIG. 13 along a plane XV—XV.

The same observation can be made in FIG. 15 which is a section along a sectional plane XV—XV parallel to that of FIG. 14 passing through the middle of the control gate. The indication of the cut planes if likewise given in FIG. 13. The control gate 264 is of the damascene type and is flush with the surface 236 of the hidden coating layer in FIG. 15.

The set of embodiments described with reference to the figures relates in each instance to an isolated memory point.

However, the methods of the invention apply in identical fashion to the collective realization of a plurality of memory points.

DOCUMENTS CITED (1)
"Novel 0.44 $\mu m^2$ Ti-salicide STI Cell Technology for High-density NOR Flash Memories and High-performance Embedded Application"
by H. WATANABE et coll. 1998 IEEE, pp. 975–978
(2)
FR-A-2 757 312
(3)
FR-A-2 750 534

What is claimed is:

1. A method for manufacturing a memory having a source, a drain, a floating gate, and a control gate, said method comprising:
   a) forming a dummy gate on a substrate;
   b) forming a first lateral spacer on the exterior of said dummy gate;
   c) forming a second lateral spacer on the exterior of said first lateral spacer;
   d) realizing source and drain regions on the substrate, auto-aligned on the dummy gate;
   e) coating the dummy gate with a coating layer and planishing said coating layer, stopping at the dummy gate;
   f) removing the dummy gate entirely to form at least one gate well configured to receive the floating gate and the control gate;
   g) depositing in the at least one gate well so formed at least a first gate layer, at least an inter-gate insulating layer, and at least a second gate layer, and forming the first gate inter-gate insulating and second gate layers to define the floating gate and the control gate separated by the inter-gate insulator, the first gate layer and the insulating inter-gate layer having an overall thickness of less than a height of the gate well, wherein the depositing g) comprises, in a following order:
      depositing the first gate layer and the inter-gate insulating layer;
      etching the layers to define their extension along the source and the drain;
      electrically insulation cut-out sides of the layers obtained by the etching;
   depositing the second gate layer having a thickness sufficient to fill the gate well; and
   polishing the second gate layer, the inter-gate insulating layer, and the first gate layer and stopping at the coating layer.

2. A method for manufacturing a memory having a source, a drain, a floating gate, and a control gate, said method comprising:
   a) forming a dummy gate on a substrate;
   b) forming a first lateral spacer on the exterior of said dummy gate;
   c) forming a second lateral spacer on the exterior of said first lateral spacer;
   d) realizing source and drain regions on the substrate, auto-aligned on the dummy gate;
   e) coating the dummy gate with a coating layer and planishing said coating layer, stopping at the dummy gate, wherein the coating layer is made of an electrically conducting material to form contacting access for the source and for the drain;
   f) removing the dummy gate entirely to form at least one gate well configured to receive the floating gate and the control gate;
   g) depositing in the at least one gate well so formed at least a first gate layer, at least an inter-gate insulating layer, and at least a second gate layer, and forming the first gate inter-gate insulating and second gate layers to define the floating gate and the control gate separated by the inter-gate insulator, the first gate layer and the insulating inter-gate layer having an overall thickness of less than a height of the gate well, wherein the depositing g) comprises, in a following order:
      depositing the first gate layer;
      etching the first gate layer to define its extension along the source and the drain;
      depositing the inter-gate insulating layer and the second gate layer, the inter-gate insulating layer having, together with the first gate layer, a total thickness of less than the height of the gate well and the second gate layer having a thickness sufficient to fill the gate well; and
      polishing the second gate layer, the inter-gate insulating layer, and the first gate layer, stopping at the coating layer.

3. A method for manufacturing a memory having a source, a drain, a floating gate, and a control gate, said method comprising:
   a) forming a dummy gate on a substrate;
   b) forming a first lateral spacer on the exterior of said dummy gate;
   c) forming a second lateral spacer on the exterior of said first lateral spacer;
   d) realizing source and drain regions on the substrate, auto-aligned on the dummy gate;
   e) coating the dummy gate with a coating layer and planishing said coating layer, stopping at the dummy gate, wherein the coating layer is made of an electrically conducting material to form contacting access for the source and for the drain;

f) removing the dummy gate entirely to form at least one gate well configured to receive the floating gate and the control gate;

g) depositing in the at least one gate well so formed at least a first gate layer, at least an inter-gate insulating layer, and at least a second gate layer, and forming the first gate inter-gate insulating and second gate layers to define the floating gate and the control gate separated by the inter-gate insulator, the first gate layer and the insulating inter-gate layer having an overall thickness of less than a height of the gate well.

4. A method according to claim 3, wherein prior to the coating e), gate spacers are formed on the dummy gate using at least one electrically insulating material.

5. A method according to claim 3, wherein a material of the coating layer is an electrical insulating material.

6. A method according to claim 3, further comprising, prior to the coating e), auto-aligned siliciding of the source and drain regions.

7. A method according to claim 3, for collective production of a set of memories, wherein, at a time of the forming a), a dummy gate is formed that is common to the set of memories.

* * * * *